(12) United States Patent
Bickford et al.

(10) Patent No.: US 7,398,485 B2
(45) Date of Patent: Jul. 8, 2008

(54) YIELD OPTIMIZATION IN ROUTER FOR SYSTEMATIC DEFECTS

(75) Inventors: Jeanne P. Bickford, Essex Junction, VT (US); Markus T. Buehler, Weil im Schoenbuch (DE); Jason D. Hibbeler, Williston, VT (US); Juergen Koehl, Weil im Schoenbuch (DE); Daniel N. Maynard, Craftsbury Common, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/279,262

(22) Filed: Apr. 11, 2006

(65) Prior Publication Data

US 2007/0240090 A1 Oct. 11, 2007

(51) Int. Cl.
*G06F 17/50* (2006.01)
(52) U.S. Cl. ................... 716/2; 716/4; 716/12
(58) Field of Classification Search ........... 716/2, 716/12, 4
See application file for complete search history.

(56) References Cited

U.S. PATENT DOCUMENTS 6,927,489 B1 * 8/2005 Yaguchi et al. ............. 257/734
2001/0039644 A1 * 11/2001 Le Coz ....................... 716/11
2004/0163062 A1 * 8/2004 Chevallier et al. ............ 716/5
2005/0060676 A1 * 3/2005 Matsumura et al. ........... 716/6
2006/0101355 A1 * 5/2006 Ciplickas et al. ............. 716/2

* cited by examiner

*Primary Examiner*—Jack Chiang
*Assistant Examiner*—Suresh Memula
(74) *Attorney, Agent, or Firm*—Gibb & Rahman, LLC; Richard M. Kotulak, Esq.

(57) ABSTRACT

Embodiments herein provide a method and computer program product for optimizing router settings to increase IC yield. A method begins by reviewing yield data in an IC manufacturing line to identify structure-specific mechanisms that impact IC yield. Next, the method establishes a structural identifier for each structure-specific mechanism, wherein the structural identifiers include wire codes, tags, and/or unique identifiers. Different structural identifiers are established for wires having different widths. Furthermore, the method establishes a weighting factor for each structure-specific mechanism, wherein higher weighting factors are established for structure-specific mechanisms comprising thick wires proximate to multiple thick wires. The method establishes the structural identifiers and the weighting factors for incidence of spacing between single wide lines, double wide lines, and triple wide lines and for incidence of wires above large metal lands. Subsequently, the router settings are modified based on the structural identifiers and the weighting factors to minimize systematic defects.

17 Claims, 5 Drawing Sheets

Reduction of Systematic Short Sensitivity

|  | Default | Case 1 | Case 2 | Case 3 |
|---|---|---|---|---|
| Metal Miss | 0.096 | 0.096 | 0.096 | 0.095 |
| Metal Short | 0.064 | 0.064 | 0.064 | 0.067 |
| VIA Miss | 0.016 | 0.016 | 0.016 | 0.014 |
| Total BEOL Faults | 0.176 | 0.175 | 0.175 | 0.177 |
|  |  |  |  |  |
|  |  |  |  |  |
|  |  |  |  |  |

FIG. 2

YIELD OPTIMIZATION IN ROUTER FOR SYSTEMATIC DEFECTS

BACKGROUND

1. Field of the Invention

The embodiments of the invention provide a method, computer program product, etc. for yield optimization in router for systematic defects.

2. Description of the Related Art

In the design and manufacture of semiconductor chips, two yield detractors in the manufacturing process are random defects and systematic defects. Random defects refer to electrical faults (e.g., opens and shorts) caused by foreign material or impurities. Systematic defects—also known as process-sensitive sites—constitute electrical faults that arise because of the inherent difficulty of reliably building certain structures in a given manufacturing technology.

Systematic defects are seen in wafer processing lines. During the early life of a manufacturing line, systematic defects are a larger yield detractor than random defects. Design related systematic layout issues are observed when product reaches test. In some cases, product is redesigned to improve yield, but in many cases redesign is not possible because of customer impact. It is desirable to have routers consider systematic defects. Systematic yield sensitivity needs to be traded off with sensitivity to random defects to create the most cost effective option for the product.

Critical-area computation is known (e.g., dot-throwing, geometric expansion, Voronoi diagrams), but currently, there are no methods that use critical area analysis assessment with random defects and identification of systematic defects to optimize yield

SUMMARY

Embodiments of the invention provide a method, computer program product, etc. for optimizing router settings to increase integrated circuit yield. A method begins by reviewing yield data in an integrated circuit manufacturing line to identify structure-specific mechanisms that impact integrated circuit yield. Next, the method establishes a structural identifier for each structure-specific mechanism, wherein the structural identifiers include wire codes, tags, and/or unique identifiers. Different structural identifiers are established for structure-specific mechanisms comprising wires having different widths.

Furthermore, the method establishes a weighting factor for each structure-specific mechanism, wherein higher weighting factors are established for structure-specific mechanisms comprising thick wires proximate to multiple thick wires. The method establishes the structural identifiers and the weighting factors for spacing between single wide lines, double wide lines, and triple wide lines and for wires above large metal lands. Subsequently, the router settings are modified based on the structural identifiers and the weighting factors to minimize systematic defects.

Following this, the method tunes the router settings to minimize random defects. This includes selecting multiple representative chips and performing router test cases by routing each chip with a different weighting factor. The router test cases are performed on chips having low levels, medium levels, and/or high levels of wiring congestion. The tuning of the router settings further includes generating graphical data for the router test cases, and performing critical area analyses for the router test cases. Subsequently, a router test case is selected for tuning the router settings based on the results of the critical area analyses.

Accordingly, systematic defects have a large impact on yield (particularly early in the life of the technology). The impact is typically identified after parts are complete; thus, redesign is often not possible and yield loss is seen through the program life. Router settings that prioritize solution of systematic problems produce high yielding designs. Embodiments of the invention provide optimized yield solution for random defects and for identified systematic defects.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 2 is a table illustrating fault changes that result from selective spacing of wide and narrow wires;

DETAILED DESCRIPTION OF PREFERRED EMBODIMENTS

Figure 1:
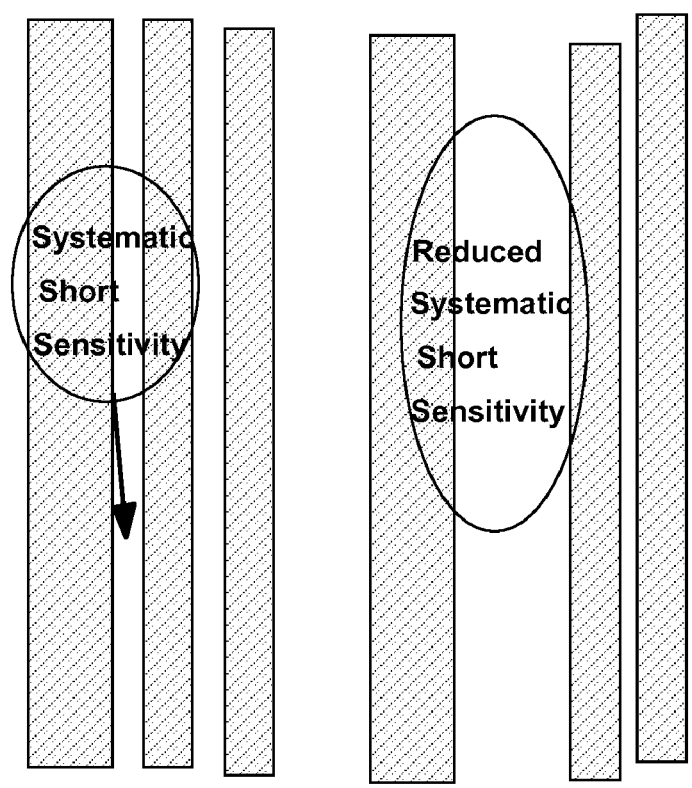
FIG. 1 is a diagram illustrating reduction of a type of systematic short sensitivity.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Thus, the examples should not be construed as limiting the scope of the embodiments of the invention.

Accordingly, systematic defects have a large impact on yield (particularly early in the life of the technology). The impact is typically identified after parts are complete; thus, redesign is often not possible and yield loss is seen through the program life. Router settings that prioritize solution of systematic problems produce high yielding designs. Embodiments of the invention provide optimized yield solution for random defects and for identified systematic defects.

Embodiments herein provide a means to optimize router settings to minimize yield impact to known systematic issues (examples: spacing between wide and narrow lines or location of wires above wide metal lands). Usually these kinds of layout related yield issues are seen after a design is complete (usually after test data becomes available). In some cases it is not possible to change the design because of time to market constraints or customer commitments. Where changes are made in the design, resource is needed to re-do the design, and rebuild parts to verify the design resulting in significant unplanned expenditure on a project. As the cost of masks and wafer processing increases, elements must be identified that could impact systematic yield loss and the elements must be embedded in the router process in a way that minimizes the systematic exposure and also minimizes the exposure to random defects. Techniques provided herein offer a way to use a router to avoid known systematic issues while minimizing yield issues caused by random defects.

Embodiments of the invention provide a method, wherein systematic sensitivity is identified by IC manufacturing line (observed yield loss on product). Unique identifiers are established for layout features that identify sensitivity (e.g., different wire widths, via placement in a particular book, via or wire placement on a particular level, etc). The router uses unique identifiers to selectively weight "systematic issue placement" (example: wide to narrow wire placement); and, router runs are made with different levels of spreading to systematic feature (low, medium, and high). Next, graphical data is generated for each router test case; and a critical area analysis is run on each test case. Results of the critical area analysis are reviewed to select the option which generates the best random defect yield while also responding to manufacturing requested systematic sensitivity. The Router Settings defined by this process are supplied to Designers. Designers are required to use Router settings established by this process This process results in layout being optimized as much as possible for the systematic problem and also sensitivity to random defects results in best yield. Router settings can be updated as manufacturing yield learning minimizes systematic defect sensitivity.

Referring to FIG. 1, the vertical rectangles represent lines. More specifically, increased space between single wide and double or triple wide lines reduces systematic short sensitivity. Prioritizing wide to narrow spaces also improves sensitivity to random defects by allowing more space for redundant vias.

FIG. 2 illustrates a table showing the results of critical area analysis evaluation of selective spacing of narrow to wide wires. Specifically, cases 1-3 are increasing instances of wide lines placed at a minimum distance to the next adjacent narrow line. Case 3 demonstrates the point where the higher number of instances of wide lines spaced at a minimum allowed distance to the narrow line starts to significantly increase the number of shorts.

Techniques of embodiments herein are used to optimize router settings for spacing between single wide, double wide, and triple wide lines. There are several steps that would identify the use of this method: wirecode input to identify shapes; and router or defect analysis information describing technique and identifying Router identifiable tags for special layouts.

Thus, embodiments of the invention provide a method, computer program product, etc. for optimizing router settings to increase integrated circuit yield. A method begins by reviewing yield data in an integrated circuit manufacturing line to identify structure-specific mechanisms that impact integrated circuit yield. As discussed above, systematic sensitivity is identified by IC manufacturing line (observed yield loss on product). Next, the method establishes a structural identifier for each structure-specific mechanism, wherein the structural identifiers include wire codes, tags, and/or unique identifiers. Different structural identifiers are established for structure-specific mechanisms comprising wires having different widths. For example, wire codes can be established for layout features that identify sensitivity, such as different wire widths, via placement in a particular book, via or wire placement on a particular level, etc.

Furthermore, the method establishes a weighting factor for each structure-specific mechanism, wherein higher weighting factors are established for structure-specific mechanisms comprising thick wires proximate to multiple thick wires. The method establishes the structural identifiers and the weighting factors for the allowed incidence for placement of single wires spaced a minimum distance from double wide lines, and triple wide lines or for placement of wires above large metal lands. For example, FIG. 1 illustrates that increased space between single wide and double or triple wide lines reduces systematic short sensitivity. Subsequently, the router settings are modified based on the structural identifiers and the weighting factors to minimize systematic defects. As discussed above, systematic defects have a large impact on yield, particularly early in the life of the technology.

Following this, the method tunes the router settings to minimize random defects. As discussed above, systematic yield sensitivity needs to be traded off with sensitivity to random defects to create the best option for the product. This includes selecting multiple representative chips and performing router test cases by routing each chip with a different weighting factor. The router test cases are performed on chips having low levels, medium levels, and/or high levels of wiring congestion. The tuning of the router settings further includes generating graphical data for the router test cases, and performing critical area analyses for the router test cases. As discussed above, critical-area computation could include dot-throwing, geometric expansion, and/or Voronoi diagrams. Subsequently, a router test case is selected for tuning the router settings based on the results of the critical area analyses. As discussed above, router settings can be updated as manufacturing yield learning minimizes systematic defect sensitivity.

Figure 3A:
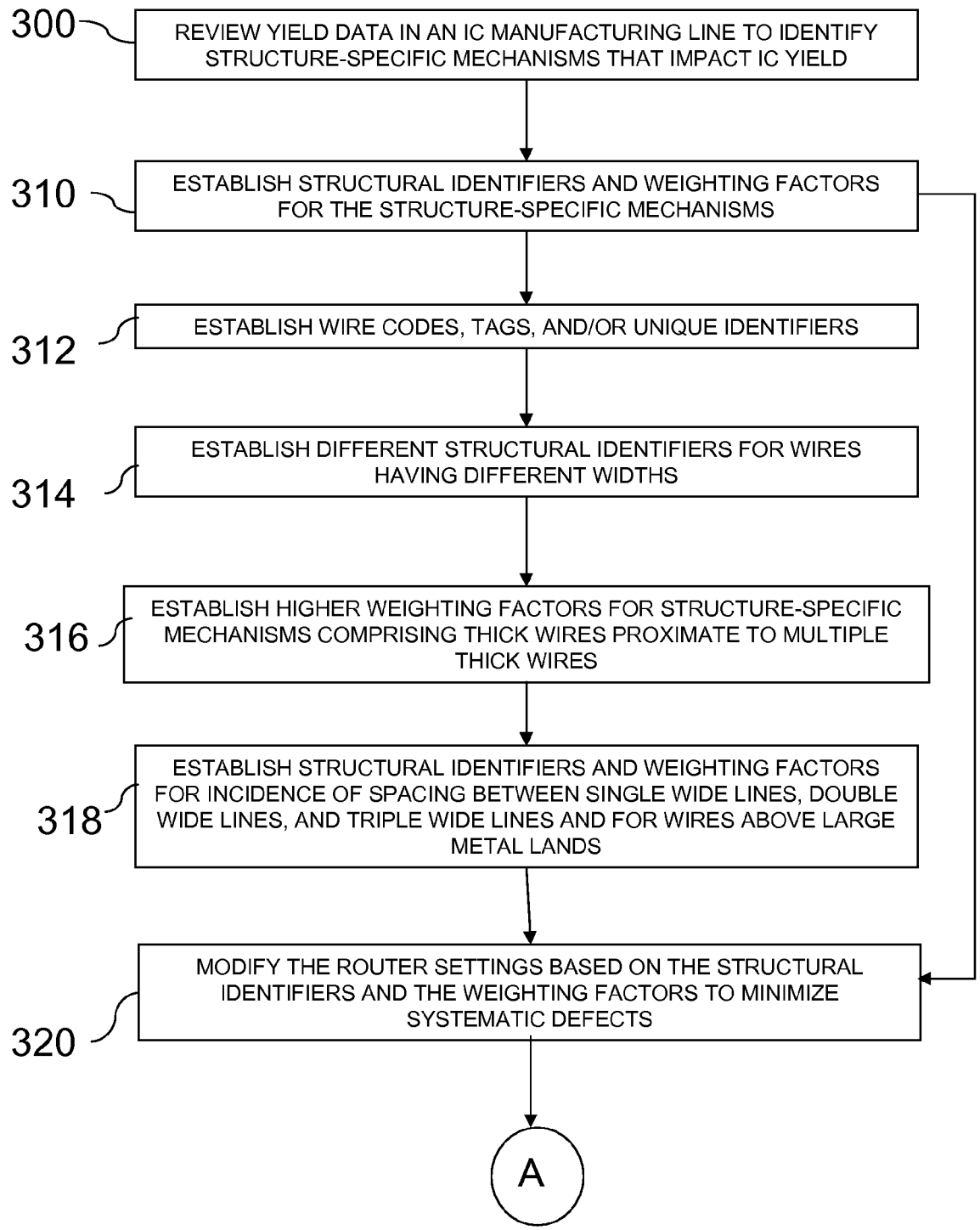
FIGS. 3A and 3B are flow diagrams illustrating a method of optimizing router settings to increase integrated circuit yield.
Figure 3B:
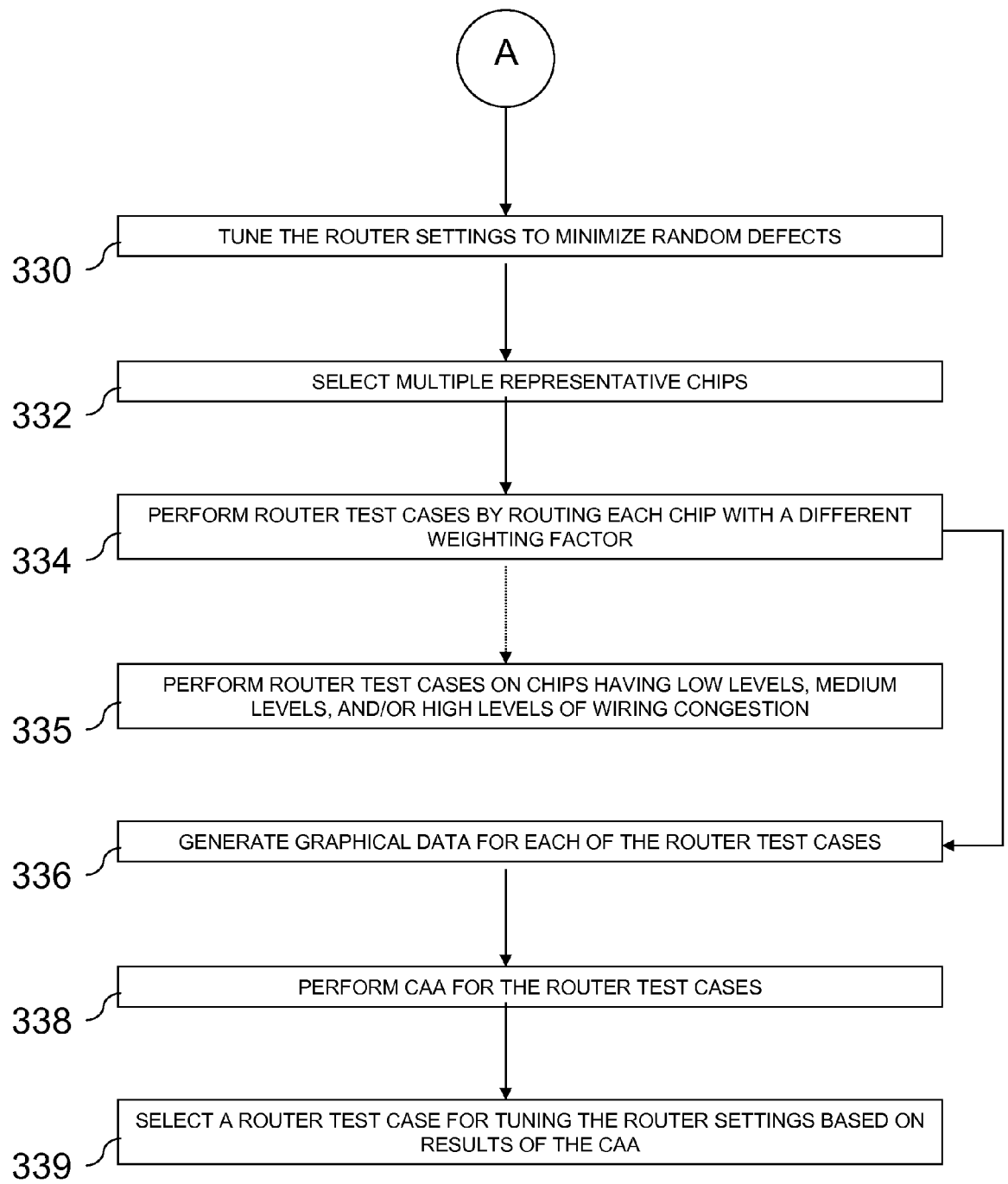

FIGS. 3A and 3B illustrate flow diagrams for a method of optimizing router settings to increase integrated circuit (IC) yield. The method begins, in item 300, by reviewing yield data in an integrated circuit manufacturing line to identify structure-specific mechanisms that impact integrated circuit yield. As discussed above, systematic sensitivity is identified by line (observed yield loss on product).

Next, in item 310, structural identifiers and weighting factors are established for the structure-specific mechanisms. This includes establishing wire codes, tags, and/or unique identifiers (item 312); establishing different structural identifiers for the structure-specific mechanisms comprising wires having different widths (item 314); establishing higher placement weighting factors for structure-specific mechanisms comprising thick wires proximate to multiple thick wires (item 316); and, establishing structural identifiers and weighting factors for spacing between single wide lines, double wide lines, and triple wide lines and for wires above large metal lands (item 318). For example, FIG. 2 illustrates a table showing selective spacing to wide wires, wherein case 3 demonstrates the point where increasing wide to narrow line spacing results in narrow lines becoming too close and increasing shorts.

In item 320, the router settings are subsequently modified based on the structural identifiers and the weighting factors to minimize systematic defects. As discussed above, systematic defects have a large impact on yield, particularly early in the life of the technology.

Following this, in item 330, the router settings are tuned to minimize random defects. As discussed above, systematic yield sensitivity needs to be traded off with sensitivity to random defects to create the best option for the product. More specifically, referring to FIG. 3B, the tuning of the router settings includes selecting multiple representative chips (item 332); and performing router test cases by routing each chip with a different weighting factor (item 334). This involves performing router test cases on chips having low levels, medium levels, and/or high levels of wiring congestion (item 335). Next, graphical data is generated (item 336) and critical area analyses (CAA) are performed (item 338) for each of the router test cases. As discussed above, critical-area computation could include dot-throwing, geometric expansion, and/or Voronoi diagrams. Subsequently, a router test case is selected for tuning the router settings based on results of the critical area analyses (item 339). As discussed above, router settings can be updated as manufacturing yield learning minimizes systematic defect sensitivity.

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 4:
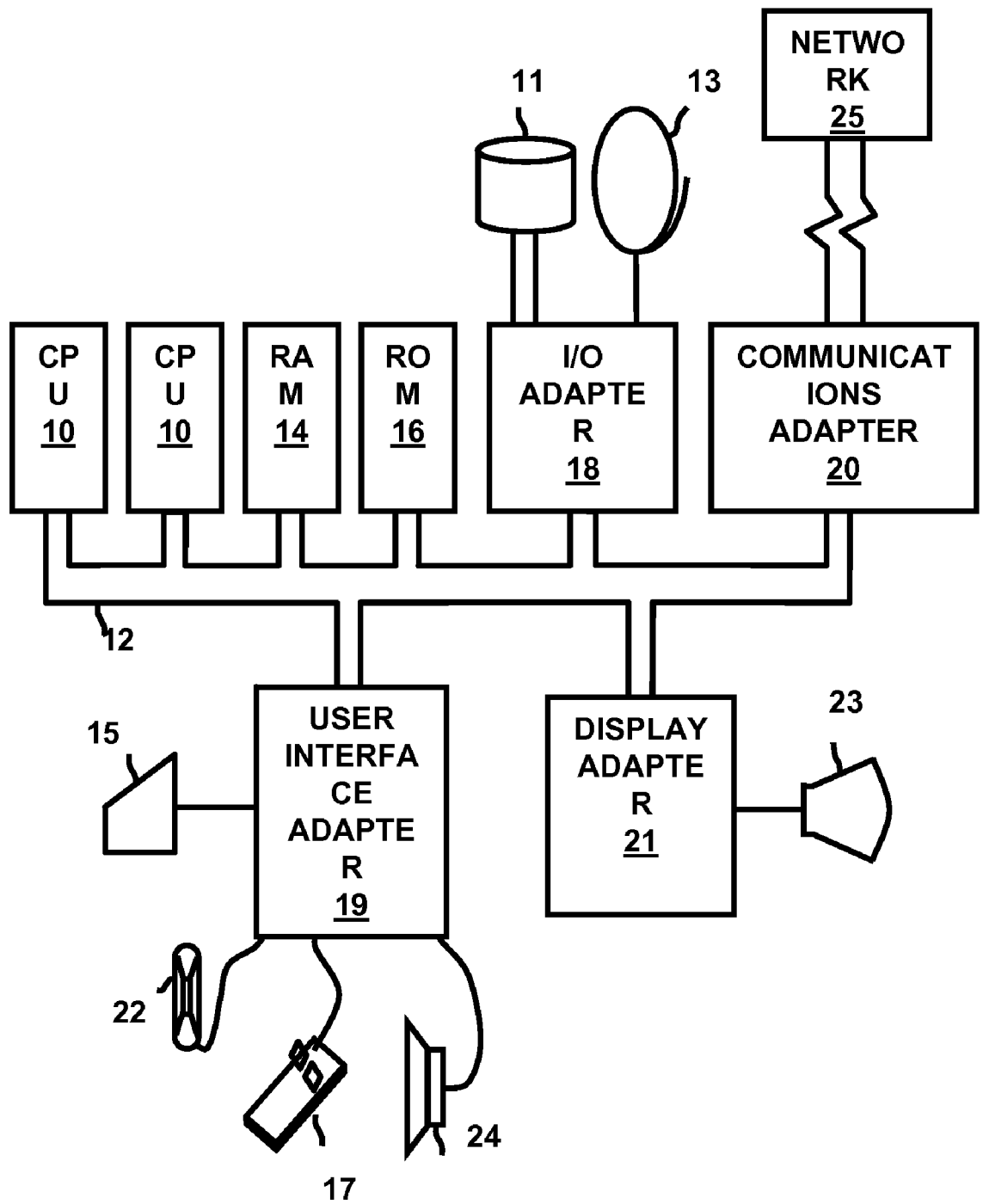
FIG. 4 is a diagram illustrating a computer program product.

A representative hardware environment for practicing the embodiments of the invention is depicted in FIG. 4. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Accordingly, systematic defects have a large impact on yield (particularly early in the life of the technology). The impact is typically identified after parts are complete; thus, redesign is often not possible and yield loss is seen through the program life. Router settings that prioritize solution of systematic problems produce high yielding designs. Embodiments of the invention provide optimized yield solution for random defects and for identified systematic defects.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of optimizing router settings to increase integrated circuit yield, comprising:

reviewing yield data in an integrated circuit manufacturing line to identify structure-specific mechanisms that impact said integrated circuit yield;

establishing one of a plurality of structural identifiers and one of a plurality of weighting factors for each of said structure-specific mechanisms, comprising establishing weighting factors comprising lower values relative to other weighting factors to structure-specific mechanisms comprising single wires spaced a minimum distance from at least one of double wires and triple wires;

modifying said router settings based on said structural identifiers and said weighting factors to minimize layout placement of structures that are known to create systematic defects; and tuning said router settings to minimize random defects, comprising:

selecting multiple representative chips, performing router test cases by routing each of said chips with a different weighting factor, generating graphical data for each of said router test cases, performing a critical area analysis for each of said router test cases, and selecting a router test case for said tuning of said router settings based on results of said critical area analysis.

2. The method according to claim 1, all the limitations of which are incorporated herein by reference, wherein said establishing of said structural identifiers comprises establishing at least one of a wire code, a tag, and a unique identifier for each of said structure-specific mechanisms.

3. The method according to claim 1, all the limitations of which are incorporated herein by reference, wherein said establishing of said structural identifiers comprises establishing different structural identifiers for wires comprising different widths.

4. The method according to claim 1, all the limitations of which are incorporated herein by reference, wherein said establishing of said weighting factors comprises establishing higher weighting factors for structure-specific mechanisms comprising wires proximate to multiple wires, relative to other structure-specific mechanisms.

5. The method according to claim 1, all the limitations of which are incorporated herein by reference, wherein said performing of said router test cases is performed on said chips comprising at a representative sample of target wiring congestion.

6. The method according to claim 1, all the limitations of which are incorporated herein by reference, all the limitations of which are incorporated herein by reference, wherein said establishing of said structural identifiers and of said weighting factors for said structure-specific mechanisms comprises establishing structural identifiers and weighting factors for incidence of spacing between single wide lines, double wide lines, and triple wide lines.

7. The method according to claim 1, all the limitations of which are incorporated herein by reference, wherein said establishing of said structural identifiers and of said weighting factors for said structure-specific mechanisms comprises establishing structural identifiers and weighting factors for incidence of wires above metal lands.

8. A method of optimizing router settings to increase integrated circuit yield, comprising:

reviewing yield data in an integrated circuit manufacturing line to identify structure-specific mechanisms that impact said integrated circuit yield;

establishing one of a plurality of structural identifiers and one of a plurality of weighting factors for each of said structure-specific mechanisms, comprising establishing different structural identifiers for wires comprising different widths, establishing weighting factors comprising lower values relative to other weighting factors to structure-specific mechanisms comprising single wires spaced a minimum distance from at least one of double wires and triple wires, and establishing structural identifiers and weighting factors for incidence of wires above metal lands;

modifying said router settings based on said structural identifiers and said weighting factors to minimize layout placement of structures that are known to create systematic defects; and tuning said router settings to minimize random defects, comprising:

selecting multiple representative chips, performing router test cases by routing each of said chips with a different weighting factor, generating graphical data for each of said router test cases, performing a critical area analysis for each of said router test cases, and selecting a router test case for said tuning of said router settings based on results of said critical area analysis.

9. The method according to claim 8, all the limitations of which are incorporated herein by reference, wherein said establishing of said structural identifiers comprises establishing at least one of a wire code, a tag, and a unique identifier for each of said structure-specific mechanisms.

10. The method according to claim 8, all the limitations of which are incorporated herein by reference, wherein said establishing of said weighting factors comprises establishing higher weighting factors for structure-specific mechanisms comprising wires proximate to multiple wires, relative to other structure-specific mechanisms.

11. The method according to claim 8, all the limitations of which are incorporated herein by reference, wherein said performing of said router test cases is performed on said chips comprising at a representative sample of target wiring congestion.

12. The method according to claim 8, all the limitations of which are incorporated herein by reference, wherein said establishing of said structural identifiers and of said weighting factors for said structure-specific mechanisms comprises establishing structural identifiers and weighting factors for incidence of spacing between single wide lines, double wide lines, and triple wide lines.

13. A method of optimizing router settings to increase integrated circuit yield, comprising:

reviewing yield data in an integrated circuit manufacturing line to identify structure-specific mechanisms that impact said integrated circuit yield;

establishing one of a plurality of structural identifiers for each of said structure-specific mechanisms, comprising establishing different structural identifiers for wires comprising different widths;

establishing one of a plurality of weighting factors for each of said structure-specific mechanisms, comprising establishing higher weighting factors for structure-specific mechanisms comprising wires proximate to multiple wires, relative to other weighting factors, establishing weighting factors comprising lower values relative to other weighting factors to structure-specific mechanisms comprising single wires spaced a minimum distance from at least one of double wires and triple wires, establishing structural identifiers and weighting factors for incidence of wires above metal lands, and establishing structural identifiers and weighting factors for incidence of spacing between single wide lines, double wide lines, and triple wide lines;

modifying said router settings based on said structural identifiers and said weighting factors to minimize layout placement of structures that are known to create systematic defects; and tuning said router settings to minimize random defects, comprising:

selecting multiple representative chips, performing router test cases by routing each of said chips with a different weighting factor, generating graphical data for each of said router test cases, performing a critical area analysis for each of said router test cases, and selecting a router test case for said tuning of said router settings based on results of said critical area analysis.

14. The method according to claim 13, all the limitations of which are incorporated herein by reference, wherein said establishing of said structural identifiers comprises establishing at least one of a wire code, a tag, and a unique identifier for each of said structure-specific mechanisms.

15. The method according to claim 13, all the limitations of which are incorporated herein by reference, wherein said performing of said router test cases is performed on said chips comprising at least one of a low level of wiring congestion, a medium level of wiring congestion, and a high level of wiring congestion.

16. A computer program product comprising a computer usable medium having a computer readable program, wherein the computer readable program, when executed on a computer, causes the computer to perform a method comprising:

reviewing yield data in an integrated circuit manufacturing line to identify structure-specific mechanisms that impact said integrated circuit yield;

establishing one of a plurality of structural identifiers and one of a plurality of weighting factors for each of said structure-specific mechanisms, comprising establishing weighting factors comprising lower values relative to other weighting factors to structure-specific mechanisms comprising single wires spaced a minimum distance from at least one of double wires and triple wires;

modifying said router settings based on said structural identifiers and said weighting factors to minimize systematic defects; and tuning said router settings to minimize random defects, comprising:
selecting multiple representative chips,
performing router test cases by routing each of said chips with a different weighting factor,
generating graphical data for each of said router test cases,
performing a critical area analysis for each of said router test cases, and
selecting a router test case for said tuning of said router settings based on results of said critical area analysis.

17. The computer program product according to claim 16, all the limitations of which are incorporated herein by reference, wherein said establishing of said structural identifiers comprises establishing different structural identifiers for wires comprising different widths.

* * * * *